United States Patent
Vali et al.

(10) Patent No.: US 10,102,903 B1
(45) Date of Patent: Oct. 16, 2018

(54) WRITE PROCESS FOR A NON VOLATILE MEMORY DEVICE

(71) Applicants: Tommaso Vali, Marine (IT); Violante Moschiano, Bacoli (IT); Andrea D'Alessandro, Avezzano (IT); Pranav Kalavade, San Jose, CA (US)

(72) Inventors: Tommaso Vali, Marine (IT); Violante Moschiano, Bacoli (IT); Andrea D'Alessandro, Avezzano (IT); Pranav Kalavade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/476,654

(22) Filed: Mar. 31, 2017

(51) Int. Cl.
  *G11C 11/34* (2006.01)
  *G11C 11/56* (2006.01)
  *G11C 16/10* (2006.01)
  *G11C 16/34* (2006.01)

(52) U.S. Cl.
  CPC .......... *G11C 11/5628* (2013.01); *G11C 16/10* (2013.01); *G11C 16/3459* (2013.01)

(58) Field of Classification Search
  CPC .. G11C 11/5628; G11C 16/10; G11C 16/3459
  USPC ....................................... 365/185.03, 185.18
  See application file for complete search history.

(56) References Cited

U.S. PATENT DOCUMENTS

| | | | |
|---|---|---|---|
| 9,269,446 B1* | 2/2016 | Magia | G11C 16/10 |
| 9,305,659 B2* | 4/2016 | Vali | G11C 16/10 |
| 9,564,226 B1* | 2/2017 | Dunga | G11C 16/10 |
| 2005/0190603 A1* | 9/2005 | Lee | G11C 11/5628 365/185.22 |
| 2010/0091568 A1* | 4/2010 | Li | G11C 11/5628 365/185.09 |
| 2012/0243323 A1* | 9/2012 | Dong | G11C 11/5628 365/185.19 |
| 2013/0028022 A1* | 1/2013 | Vali | G11C 16/10 365/185.18 |
| 2013/0155769 A1* | 6/2013 | Li | G11C 11/5628 365/185.03 |
| 2016/0019947 A1* | 1/2016 | Pang | G11C 11/5628 365/185.03 |
| 2016/0300607 A1* | 10/2016 | Magia | G11C 16/3459 |

\* cited by examiner

*Primary Examiner* — Viet Q Nguyen
(74) *Attorney, Agent, or Firm* — Compass IP Law, PC

(57) ABSTRACT

An apparatus is described. The apparatus includes a non volatile memory device that includes a controller to implement a coarse write process for the non volatile memory device. The non volatile memory device includes storage cells to store more than two logic states, wherein, the coarse write process is to perform a verify operation early in the coarse write process to identify less responsive storage cells and provide additional charge to the less responsive storage cells as compared to non less responsive storage cells that are to be programmed to a same logical state as the less responsive storage cells without performing a following verify operation after each pulse of charge applied during the coarse write process.

20 Claims, 10 Drawing Sheets

WRITE PROCESS FOR A NON VOLATILE MEMORY DEVICE

FIELD OF INVENTION

The field of invention pertains generally to semiconductor devices, and, more specifically, to an improved write process for a non volatile memory device.

BACKGROUND

Access times are critical performance parameters of memory and storage devices. As such, engineers are highly motivated to reduce the write and/or read times of such devices.

FIGURES

A better understanding of the present invention can be obtained from the following detailed description in conjunction with the following drawings, in which.

DETAILED DESCRIPTION

The storage cells of traditional semiconductor memories, such as dynamic random access memory (DRAM) and static random access memory (SRAM), are only capable of storing two different logic states: a logical 1 or a logical 0. Here, such storage cells are designed to hold only two different voltage levels, one of which corresponds to a logical 1, the other of which corresponds to a logical 0. The individual storage cells of a NAND flash memory, by contrast, are able to store more than two voltage levels. As such, NAND flash memory cells are able to store more than two logic states per storage cell.

Figure 1:
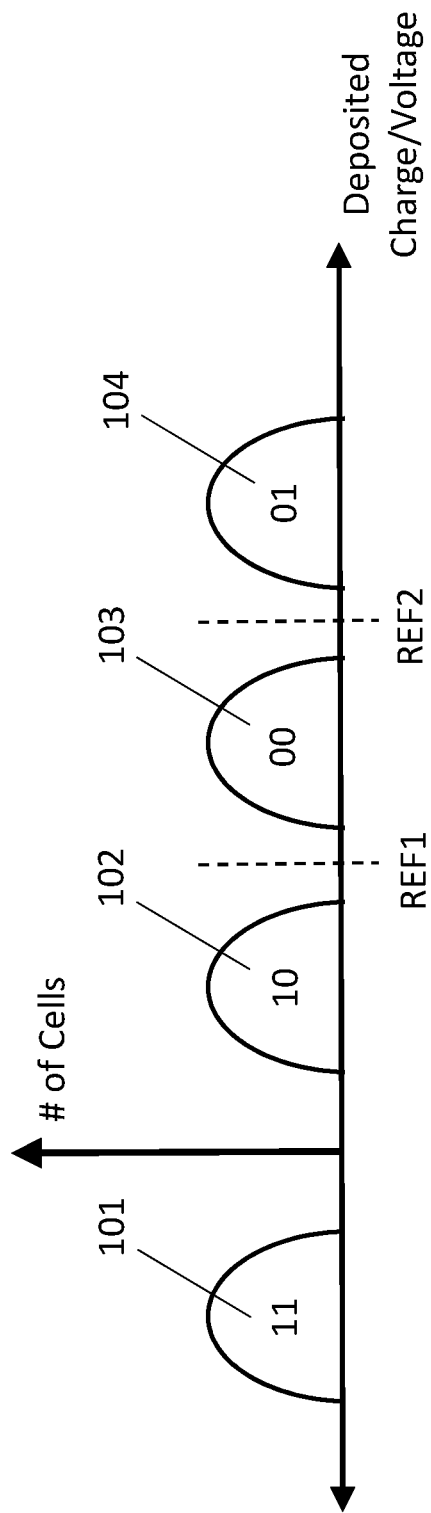
FIG. 1 shows different stored logic states for a multi-level storage cell.

FIG. 1 shows the different logic states that can be stored by a multi-level cell (mlc) NAND flash memory. Here, each distribution 101, 102, 103, 104 represents a different stored voltage level (which may also be viewed as a stored charge level) that can be stored by an mlc NAND flash cell. As observed in FIG. 1, because an mlc NAND flash cell is able to store four different voltage/charge levels, the cell is designed to store four different logic states: 11, 10, 00 and 01. In the case of the 11 stored logic state 101, the storage cell stores a negative voltage (the cell stores net negative charge). In the case of the 10, 00 and 01 stored logic states 102, 103, 104, the storage cell stores an increasingly larger positive voltage (the cell stores increasingly more positive charge) with each next stored logic state.

As observed in FIG. 1, in the case of the 10 stored logic state 102, the cell stores a positive voltage beneath a first reference voltage REF1; in the case of the 00 stored logic state 103, the cell stores a positive voltage between a second reference voltage REF2 and the first reference REF1 voltage; in the case of the 01 stored logic state 104, the cell stores a positive voltage above the second reference voltage REF2. Thus, during a write operation, an amount of voltage/charge that corresponds to one of the logic states is written into a cell to store the particular logic state. Likewise, during a subsequent read operation of the cell, the cell will provide a voltage that corresponds to the particular logic state.

As is understood in the art, a FLASH memory array is designed as a plurality of rows (also referred to as word lines) and a plurality of orthogonally oriented columns (also referred to as bit lines) in accordance with embodiments. A read address activates one of the word lines which couples the storage cells of the activated word line to the bit lines that cross the activated word line (the bit lines also cross other word lines in the array but they are not activated). Each of the storage cells that are coupled to the activated word line places its stored charge onto its respective bit line. The amount of charge is then interpreted as one of the four logic states.

Write operations are traditionally performed by activating a word line and then storing an appropriate amount of charge into those cells being written to (e.g., those cells that need to store a different logic state than what is currently being stored). Here, those of the cells that are to store logic state 104 are provided more charge than those of the cells that are to store logic state 103, and, those of the cells that are to store logic state 103 are provided more charge than those of the cells that are to store logic state 102. After the correct amount of charge has been written into all the cells on the activated word line that need to be written to, the write process moves to a next word line in the array and repeats the process. After all word lines have been activated and had their corresponding cells written to the write process is complete.

Figure 2:
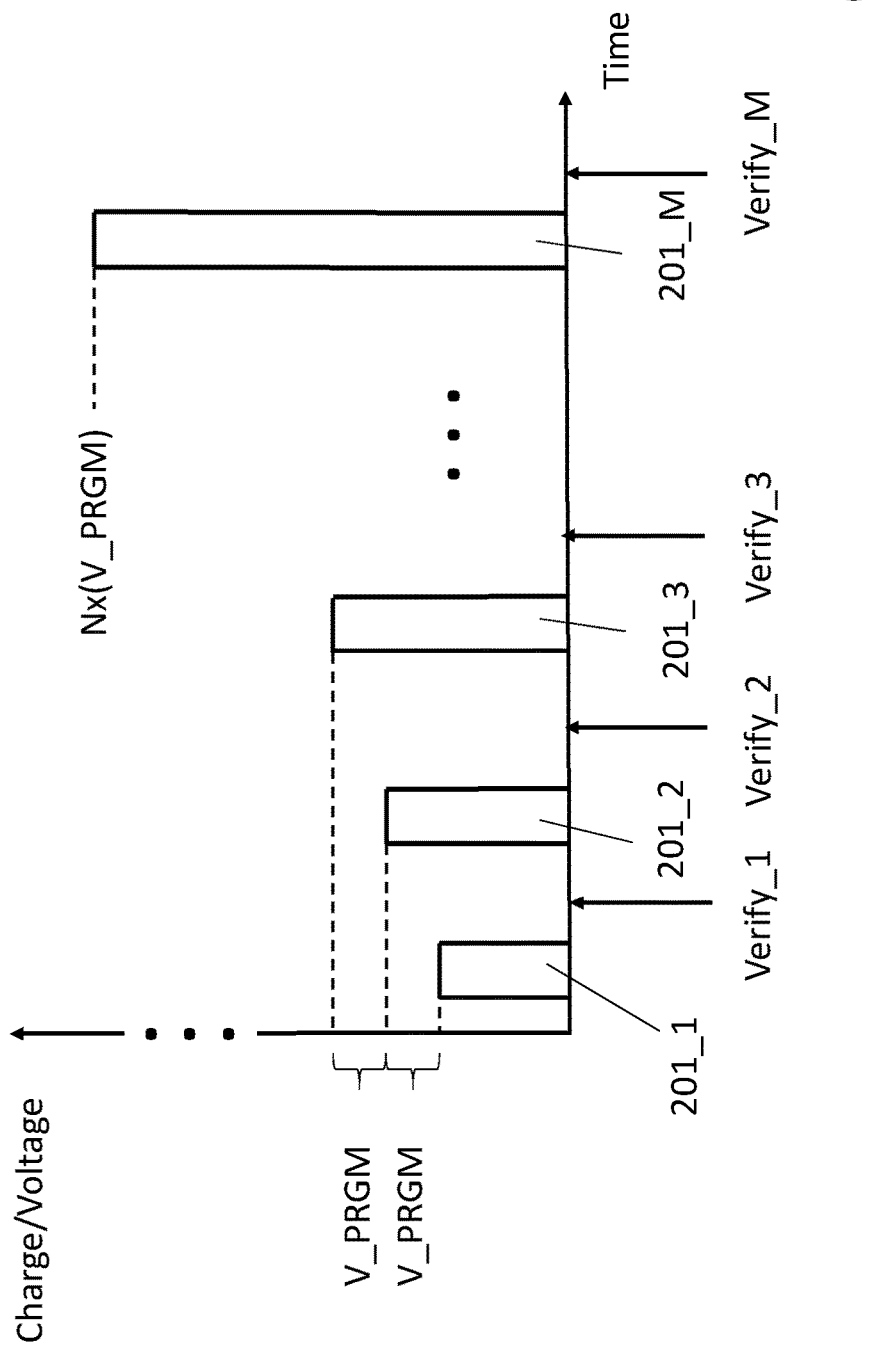
FIG. 2 shows a prior art coarse phase write process.
Figure 3:
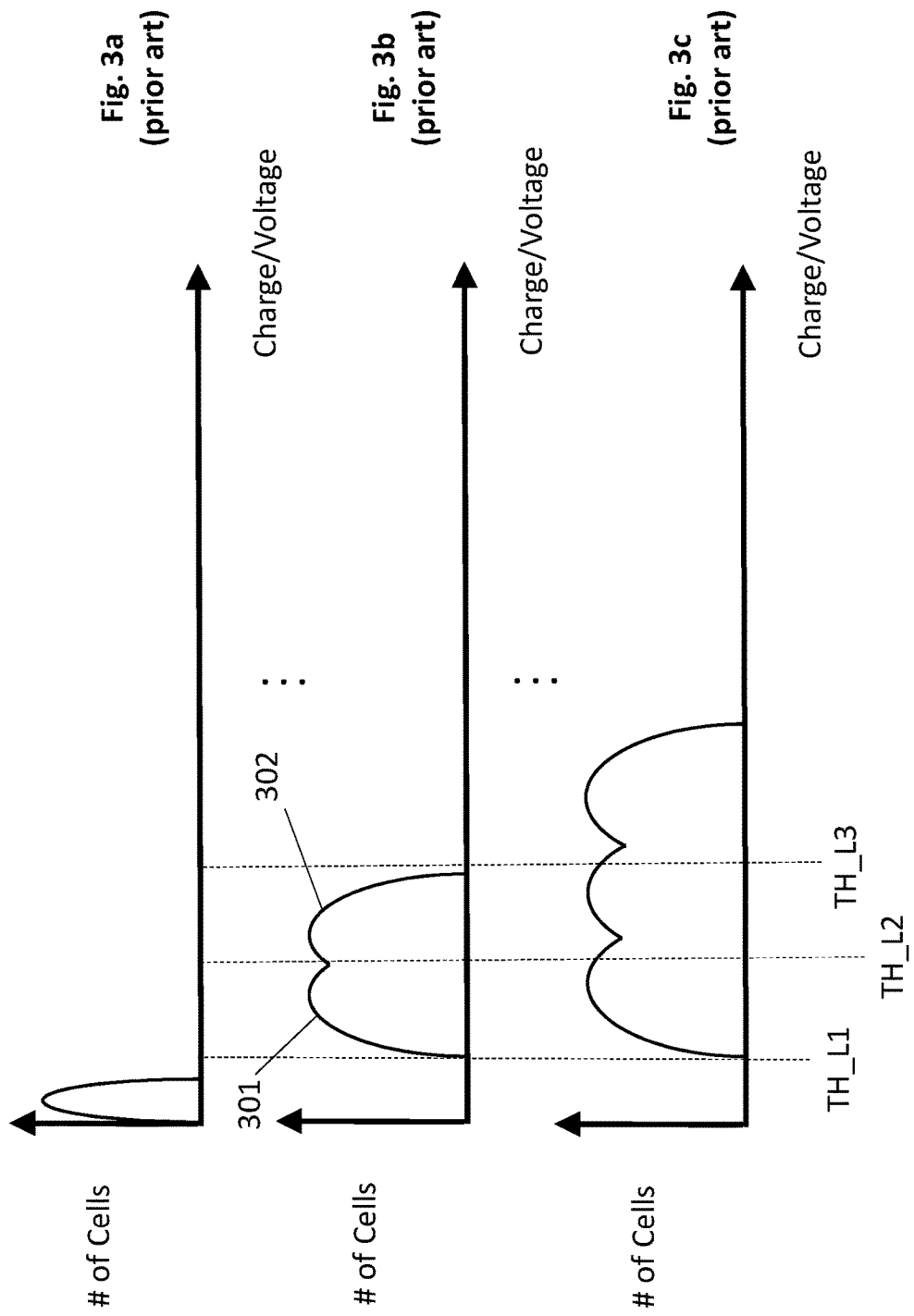
FIGS. 3a, 3b and 3c depict charge distributions for the prior art coarse phase write process of FIG. 2.

FIG. 2 and FIGS. 3a through 3c depict a "coarse phase" of the prior art word line write process in more detail. As observed in FIG. 2, a first pulse of charge 201_1 is applied to all of the cells that are to be written to irrespective of which particular logic state they are to hold. That is, the first pulse of charge 201_1 is received by any cell that is to change its stored information regardless of which logic state the new information corresponds to. FIG. 3a shows the distribution of charge that is stored by the cells after they have received the first pulse 201_1.

As a consequence, e.g., of manufacturing tolerances, etc., the various cells that are being written to along the word line respond differently to the pulse of charge that they received. More specifically, some cells are less efficient or responsive than other cells (the more responsive/efficient cells charge faster while the less responsive/efficient cells charge slower). Referring briefly back to FIG. 1, each of the depicted logic states 101 through 104 show a spread or distribution of the voltage/charge levels that the cells that have been programmed for a particular logic state hold. The left side of each distribution represents those cells that were less responsive to their received charge while the right side of each distribution represent those cells that were more responsive to their received charge. FIG. 3a shows a similar spread of responsivity from all the cells after they received the initial pulse 201_1.

After the first pulse of charge 201_1 is transferred to the cells being written to, a first verify operation (Verify_1) is performed. A verify operation reads each storage cell that was just written to by the prior charge pulse (in this case, pulse 201_1) and compares it against a minimum required voltage threshold for the particular logic state that the cell is being programmed to store. Here, referring to FIG. 3a, the cells that are to be programmed with the highest voltage logic state 104 are tested against a higher threshold TH_L3 than the cells that are to be programmed with the middle voltage logic state 103 are tested against (TH_L2). Likewise, the cells that are to be programmed with the middle voltage logic state 103 are tested against a higher threshold TH_L2 than the cells that are to be programmed with the lowest voltage logic state 103 (TH_L1). If during a verify operation any cell is determined to surpass its threshold for its particular logic state, that cell's identity is recorded and receives no more charge during the course phase.

As observed in FIG. 3a, none of the cells are deemed to have surpassed their corresponding thresholds (all cells are beneath the lowest threshold TH_L1). As such, none of the cells are identified as having surpassed their threshold benchmark. Referring to FIG. 2, a second pulse of charge 201_2 is again applied to all the cells that are to be written to. Note that the second pulse 201_2 applies more charge than the first pulse 201_1. Here, increased charge may be applied, e.g., by generating a higher voltage write pulse. A characteristic of the second pulse 201_2 is that its amplitude is a discrete voltage amount V_PRGM higher than the voltage of the first pulse 201_1. Here, the coarse phase is characterized in that the V_PRGM step voltage is fairly large. As will be discussed in more detail further below, the large V_PRGM step voltage results in a wide charge distribution of the cells that are written to during the coarse phase.

After the second pulse 201_2 is applied and another verify operation is performed (VERIFY_2), once again, often, none of the cells have sufficient charge when measured against their respective thresholds. As such, a third pulse 201_3 is applied having a next V_PRGM amplitude increment over and above that of the second pulse 201_2. The process of applying an incremented pulse followed by a verify operation repeats. Eventually, typically, some of the cells that are to be written to with the lowest voltage logic state 102 are determined to surpass the TH_L1 threshold. As such, these cells are marked to no longer receive any more pulses.

FIG. 3b shows the charge distributions for all the cells being written to after the last cell(s) being programmed into the lowest voltage state 102 have surpassed the TH_L1 threshold. Here, the overall charge distribution of FIG. 3b can be seen as the superposition of two distributions. A first, left hand side distribution 301 that largely corresponds to the cells that are being programmed into the lowest voltage state 102, and, a second, right hand side distribution 302 that largely corresponds to the cells that are being programmed into the middle and higher voltage logic states 103, 104.

As such, after the charge distribution state of FIG. 3b is reached, all of the cells that are to be programmed to the lowest voltage logic state 102 have reached their required threshold and only cells that are to be programmed to the middle and highest voltage logic states 103, 104 remain. Note that some of the cells that are to be programmed to the middle voltage logic state 103 may also have reached their respective threshold (TH_L2). As such, these cells are also marked to no longer receive any more pulses. The process then repeats with each next pulse having an increment V_PRGM higher amplitude than its immediately prior pulse followed by a verify operation.

Over the successive following iterations, more and more cells will surpass their appropriate threshold and will no longer receive any more pulses. FIG. 2 indicates, by way of pulse 201_M, that M pulse and verify iterations are required to reach this state. FIG. 3c shows the charge distribution state of the cells after the last of the cells has surpassed its target threshold (usually a cell that is to be written into the highest voltage logic state 104 having surpassed the TH_L3 threshold). Here, the distribution of FIG. 3c essentially shows distributions for the three logic states with the higher tail of the lowest voltage logic state 102 overlapping the lower tail of the middle voltage logic state 103 and the higher tail of the middle voltage logic state 103 overlapping the lower tail of the highest voltage logic state 104.

Once all the cells to be programmed on the particular row have surpassed their appropriate threshold, the write process moves from a coarse phase to a fine phase for the same word line.

Figure 4:
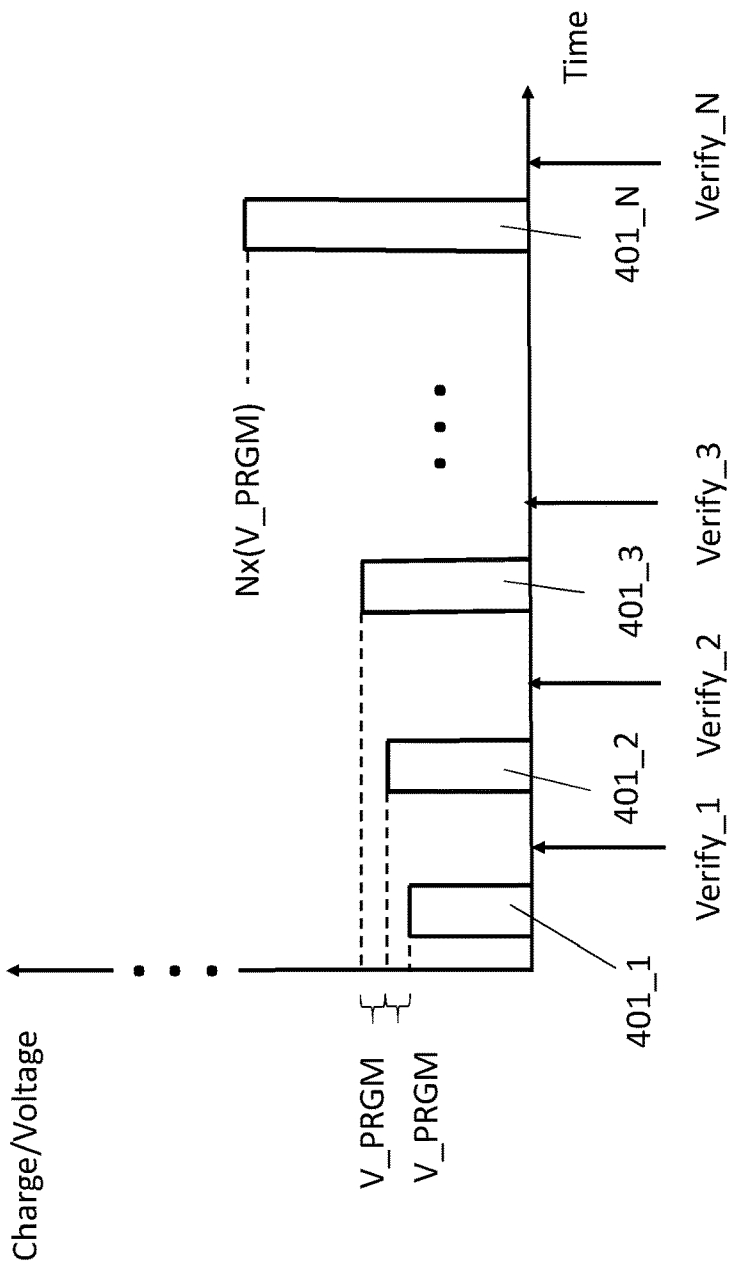
FIG. 4 shows a prior art fine phase write process.
Figure 5:
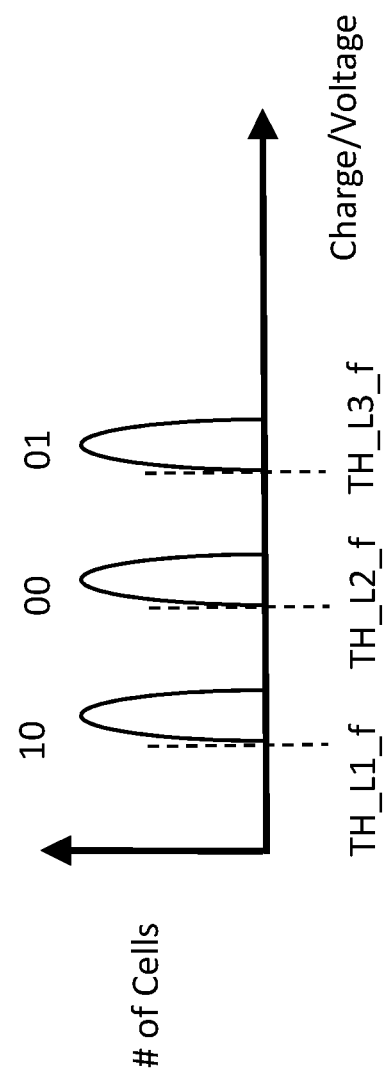
FIG. 5 shows a charge distribution for the prior art fine write process of FIG. 4.

The fine phase, which may also be referred to as selective slow program convergence (SSPV) process, is depicted in FIGS. 4 and 5. Here, the fine phase is very similar to the coarse phase except that the V_PRGM increment is less than in the coarse phase (N pulses 401_1, 401_2, 401_3, . . . 401_N and following verify operations are performed). As is understood in the art, the spread of the resulting charge distribution (the lateral expanse of the distribution tails) is a function of the V_PRGM voltage. That is, the larger the V_PRGM voltage the wider the spread, whereas, the smaller the V_PRGM voltage the smaller the spread. As such, the overlapping tails that are observed at the end of the coarse phase in FIG. 3c are largely a function of the V_PRGM voltage (the distributions are wider and therefore overlap). The higher V_PRGM voltage is nevertheless used in the coarse phase, however, because the higher pulse amplitudes charge the cells faster so overall write time is reduced.

Thus, the purpose of the smaller V_PRGM fine phase is to convert the overlapping distributions that exist at the end of the coarse phase (as depicted in FIG. 3c) into the separate distributions that represent the different logic states that are supposed to be written into the row (as depicted in FIG. 5). Here, cells that are to be written into the lowest voltage logic state 102 will eventually surpass a threshold TH_L1_f that is particular to the lowest voltage logic state 102 and be marked to no longer receive any more pulses (typically, TH_L1_f>TH_L1). Eventually all cells to be written into the lowest voltage logic state 102 will surpass the TH_L1_f threshold which corresponds to the completion of the writing of this logic state for the row.

The same process then continues to complete the writing for the middle and higher voltage logic states 103, 104. Typically, after the last cell to be written into the highest voltage logic state 104 surpasses the TH_L3_f threshold, the fine phase is completed which completes the writing process for the row. Here, as depicted in FIG. 4, the fine phase consumes N iterations of pulse and verify operations. The resulting, narrower distributions that are created with the smaller V_PRGM pulse increments are shown in FIG. 5. The write sequence then moves to a next row to repeat the entire process (coarse and fine).

The above described prior art programming processes is somewhat inefficient in that the total amount of time consumed performing the process is dictated by the responsivity of the slowest cells. That is, for both the coarse and fine phases, it is not until the verify operations reveal that the slowest cells have reached a threshold level of stored charge is the overall phase deemed complete. Said another way, typically, the slowest cell that is to be written into the highest voltage logic state 104 stretches the coarse phase to consume M iterations and the fine phase to consume N iterations. That is, the single slowest cell amongst the cells that are to be programmed into highest voltage logic state dictates the total time consumed to write to the entire row.

FIG. 6 and FIGS. 7a through 7d show an improved coarse phase method that, rather than repeatedly transfer charge to cells and waiting until the slowest cell(s) have reached their targeted threshold, instead, the improved coarse phase process immediately identifies the slowest cells and immediately provides them with additional charge. That is, rather than focusing on the identification of the faster cells and inhibiting their receipt of additional charge as in the prior art coarse phase process, instead, the improved coarse phase method focuses on identifying the slower cells and takes active measures to provide them with additional amounts of charge so as to compensate for their lack of responsiveness.

Figure 6:
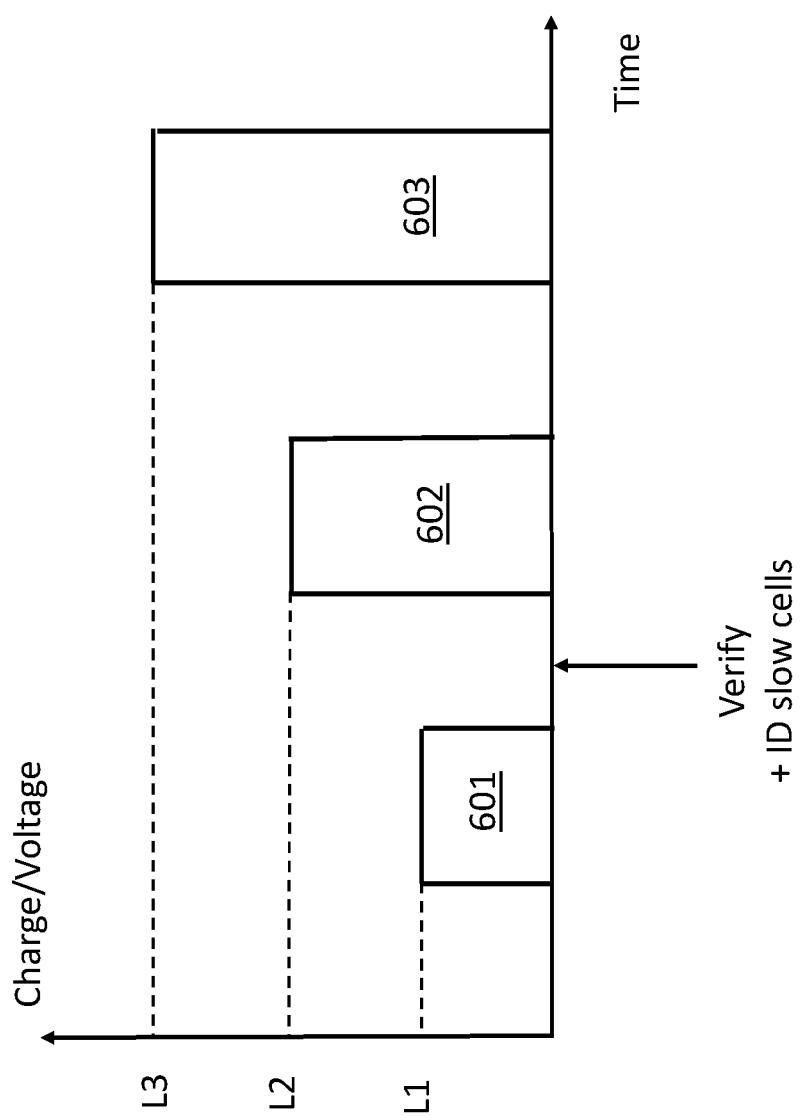
FIG. 6 shows an improved coarse phase write process.

Referring to FIG. 6, all cells to be programmed on a particular row receive an initial charge pulse 601 irrespective of the particular logic state they are to be programmed to. The initial charge pulse 601 creates an initial distribution 701 as observed in FIG. 7a. A verify operation is then performed after the initial charge pulse 601 to identify those of all the cells that were just written to that are slower. The identities of the slower cells are kept internally by the memory device (e.g., in memory coupled to the memory device's internal controller). The slowest cells may be identified by, e.g., identifying a bottom percentage of cells, such as 25% or 33% of the cells that have just been written to and that the following verify operation shows have stored the least amount of charge.

Figure 7:
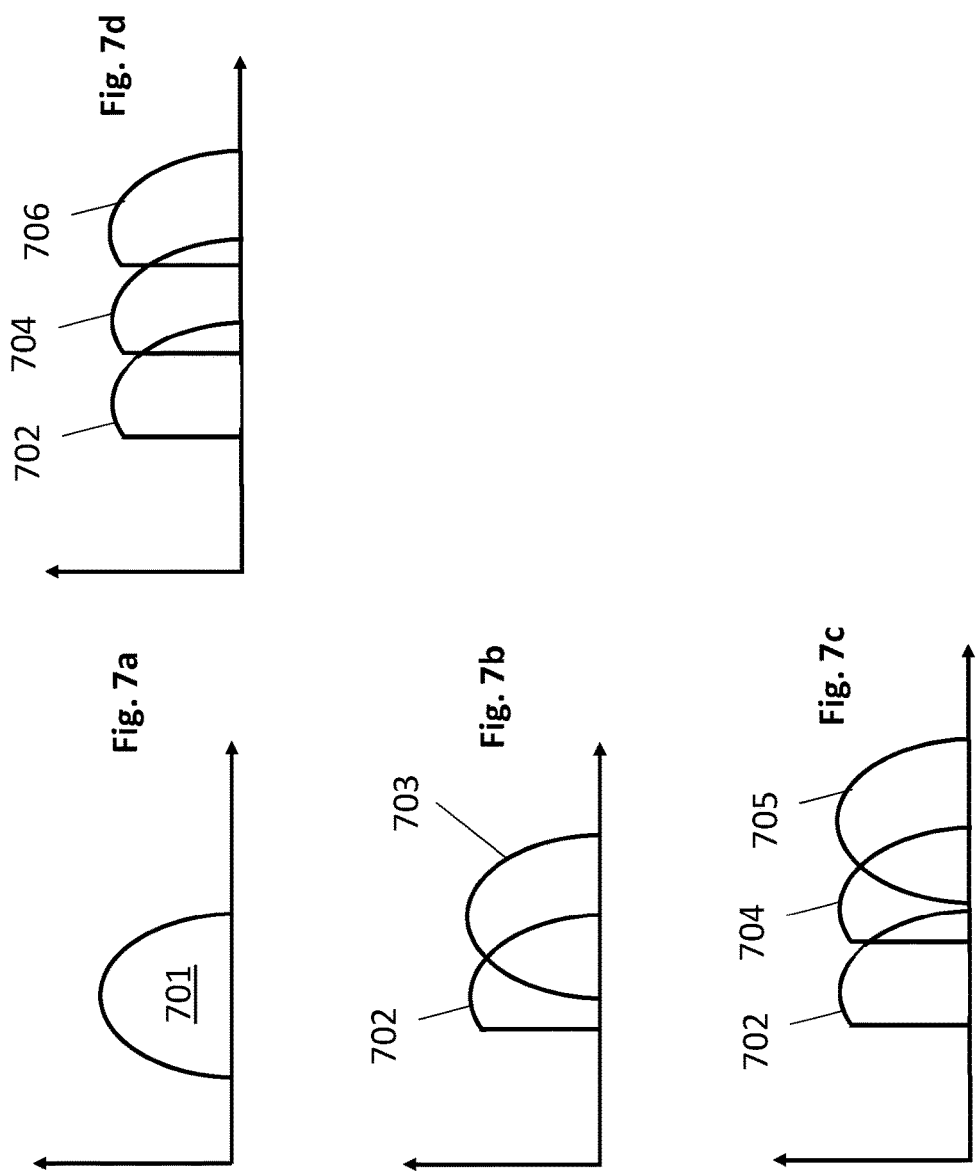
FIGS. 7a, 7b, 7c and 7d show charge distributions for the improved coarse phase write process of FIG. 6.

A second pulse 602 is then applied to the cells that are to be programmed into the middle and highest voltage logic states 103, 104 and those of the cells that are to be programmed into the lowest voltage logic state 102 that were identified as slowest (i.e., all cells are written to with pulse 602 except the cells that are to be programmed into the lowest voltage logic state 102 and that were not identified as slowest). Referring to FIG. 7b, the application of the second pulse 602 to the cells that are to be programmed into the middle and highest voltage logic states 103, 104 essentially creates distribution 703 for these cells. Additionally, the application of the second pulse 602 to the slowest of the cells that are to be programmed into the lowest voltage logic state 101 causes the distribution of all cells that are to be programmed into the lowest voltage logic state 102 to have distribution 702.

That is, the application of the second pulse 602 causes the cells that are to be programmed into the middle and highest voltage logic states 103, 104 to further increase their stored charge, and the application of the second pulse 602 to the slowest of the cells that are to be programmed into the lowest voltage logic state 102 narrows the distribution for the cells that are to be programmed into the lowest voltage logic state 102. With respect to the later point, distribution 702 essentially corresponds to the elimination of the lower tail of the initial distribution (the charge of the slower cells is increased to be more comparable to at least the average of those cells that are to be written to the lowest voltage logic state). In an embodiment, note that a verify operation is not performed after the second pulse 602 is applied.

After the second pulse 602 is applied, a third pulse 603 is applied only to those cells that are to be programmed into the highest voltage logic state 104 and those cells that were identified as slowest that are to be programmed into the middle voltage logic state 103 (i.e., none of the cells that are to be programmed into the lowest voltage logic state 102 receive the third pulse 603 nor any of the cells that are to be programmed into the middle voltage logic state 103 that were not identified as slowest). Referring to FIG. 7c, the application of the third pulse 603 to the cells that are to be programmed into the highest voltage logic state 104 essentially creates distribution 705 for these cells. Additionally, the application of the third pulse 602 to the slowest of the cells that are to be programmed into the middle voltage logic state 103 causes the distribution of all cells that are to be programmed into the middle voltage logic state 103 to have distribution 704.

That is, the application of the third pulse 603 causes the cells that are to be programmed into the highest voltage logic state 104 to further increase their stored charge, and the application of the third pulse 603 to the slowest of the cells that are to be programmed into the middle voltage logic state 103 narrows the distribution for the cells that are to be programmed into the middle voltage logic state 103. With respect to the later point, distribution 704 essentially corresponds to the elimination of the lower tail of the original distribution (the charge of the slower cells is increased to be more comparable to at least the average of those cells that are to be written to the middle voltage logic state 103). In an embodiment, a verify operation is also not performed after the third pulse 603 is applied.

In an embodiment the coarse phase is deemed complete after the third pulse 603. That is, the distributions of FIG. 7c are deemed "close enough" to begin operation of the fine phase. In an extended embodiment, a same/similar fine phase as the fine phase discussed above with respect to FIGS. 4 and 5 is performed after the improved coarse phase is performed. In another embodiment, a fourth pulse (not shown in FIG. 6) is applied only to the slow cells that are to be programmed into the highest voltage logic state 104. The resulting distribution 706 is shown in FIG. 7d which effectively corresponds to a distribution with its lower tail pushed into its main body.

Note that the coarse phase of the improved approach of FIG. 6 consumes significantly less time than the coarse phase of the prior art approach of FIG. 2 and FIGS. 3a through 3c. Here, the speed-up is achieved at least in part because each programmed logic state 102, 103, 104 receives only one primary charge transfer 601, 602, 603. Additionally, the improved approach of FIG. 6 includes only one verify operation, whereas, multiple verify operations were performed in the prior art coarse phase approach.

Although the ability to complete the course phase after only three charge pulses 601, 602, 603 and one verify operation may at first seem counter-intuitive, it is pertinent to point out that the extra charge transfers that are provided to the slower cells in the improved approach of FIG. 6 helps narrow the stored charge distributions of the different logic states which, in turn, economizes the overall writing process. The fairly wide distributions that result from the prior art coarse phase essentially cause the fine phase to consume more time to complete. That is, the wider prior art coarse phase distributions leave the slower cells only with minimal charge which causes the lesser charge transfers of the fine phase to consume even more time to complete the overall programming process.

By contrast, the extra charge that the slower cells are given in the improved coarse phase approach narrows the distributions as compared to the prior art approach. The narrowed distribution (more specifically, the eliminated lower end of the distribution) has the effect of reducing the amount of time that the fine phase will need to fully charge the cells. Thus the total amount of time consumed by the entire write process (both coarse and fine phases) can be reduced.

Note that the general improved coarse phase approach of FIG. 6 can be characterized by one or more of: 1) a fixed (pre-determined) number of charge transfers applied during the coarse phase rather than basing the number of charge transfers on the monitoring results of repeated verify operations; 2) a reduced number of verify operations (e.g., only one verify operation); 3) early identification of (e.g., all) slower cells, e.g., in a single operation regardless of their final targeted logic state; and/or, 4) application of additional charge to the slower cells identified in 3). Other embodiments besides the specific embodiment discussed above in FIG. 6 may meet some or all of the above characterizations.

In one alternate embodiment, the additional boost that is given to the slower cells may be something other than the full charge transfer that is given to cells being programmed to a higher voltage logic state. For example, the slower cells that are to be programmed to the lowest voltage logic state 102 may receive an extra boost that is less than the full L2 charge transfer 602 that is transferred to the cells that are being programmed into the middle and highest voltage logic states 103, 104.

In yet another alternate embodiment, SSPV is applied to the slower cells to boost them. This particular alternative embodiment can be seen as a form of interlacing the coarse and fine phases. For instance, after the first charge transfer 601 and verify operation, rather than apply the second pulse 602 to the slower cells that are being programmed to the lowest voltage logic state 102, instead, an SSPV process (a fine phase writing process) is applied to the slower cells.

After the slower cells are sufficiently charged by the SSPV process, the second pulse 602 is applied to the cells that are being programmed into the middle and highest voltage logic states 103, 104 which is essentially a reversion back to a coarse phase process. After the second pulse 602 is applied, the slower cells that are being programmed to the middle voltage logic state 103 are boosted with another SSPV process (which can be seen as reversion back again to a fine phase process). The process then repeats for the third pulse 603 and the highest voltage logic state 103. The nominal fine phase may commence after completion of the interlaced coarse and fine phase.

Still other embodiments may have more than one basic charge transfer per logic level and corresponding verify operation. For example, although the particular embodiment of FIG. 6 depicts only one primary charge transfer and boost per logic state, other embodiments may have more than one primary charge transfer per logic state. For example, one alternative embodiment may include two primary charge transfers and boosts per logic state, etc. Such an alternative embodiment may use just one verify operation (e.g., after the initial pulse), or may include more than one verify operation (e.g., another verify operation may be applied after the second pulse 602).

It is also pertinent to point out that although the discussion above has been directed to an mlc device having four different possible logic states per storage cell, other embodiments may have more than four possible logic states (e.g., tlc ("triple level cell" having eight possible logic states) or qlc ("quad level cell" having sixteen possible logic states)). Here, for memory devices having more logic states than an mlc device, a corresponding extra number of charge transfers may take place for each of the coarse and fine phases, etc.

Figure 8:
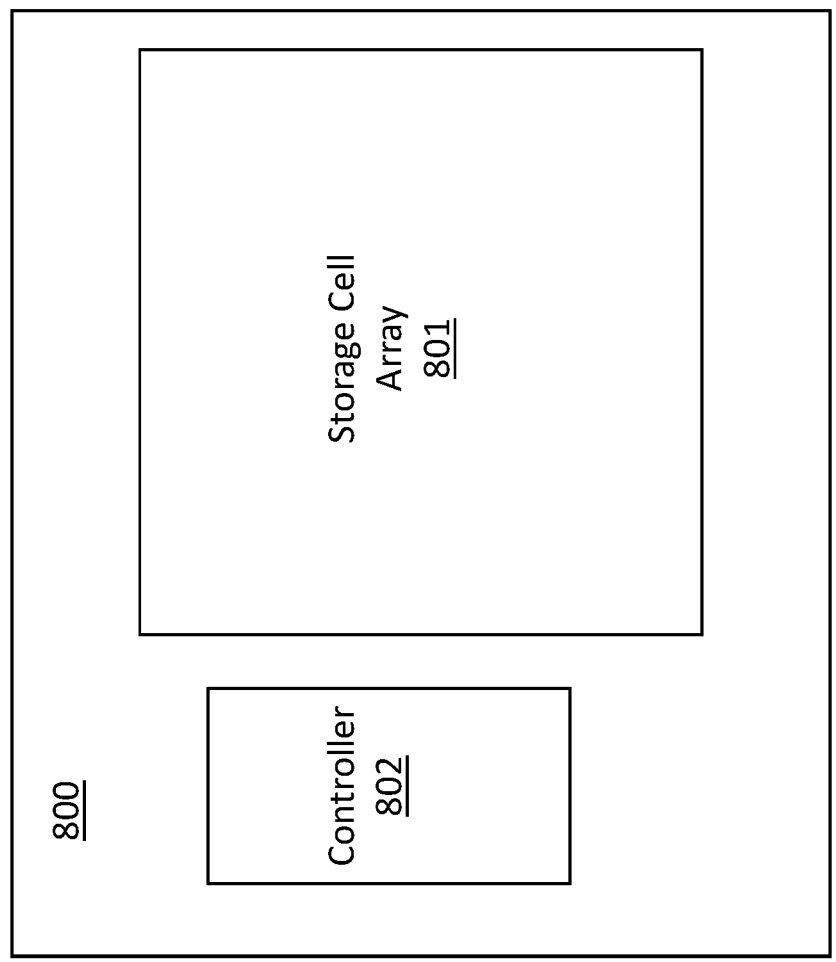
FIG. 8 shows a non volatile memory device.

FIG. 8 shows a flash memory device 800 such as a NAND flash memory device whose individual storage cells can store more than two logic states. As observed in FIG. 8, the flash chip 800 includes an array 801 of storage cells and a controller 802. In various embodiments the array is implemented as a three dimensional array of cells with, e.g., cells that are stacked together monolithically on a single semiconductor chip and/or a stack of semiconductor chips. That controller 802 may be implemented with an embedded processor and memory where the embedded processor executes program code to implement internal functions of the flash device such as the coarse and fine write process embodiments described at length above. Alternatively, the controller 802 may be implemented as dedicated hardwired logic circuitry (e.g., custom application specific integrated circuit (ASIC)) or dedicated programmed logic circuitry (e.g., field programmable gate array (FPGA), programmable logic array (PLA) or programmable logic device (PLD) or some combination dedicated logic circuitry and program code executed by an embedded processor.

Figure 9:
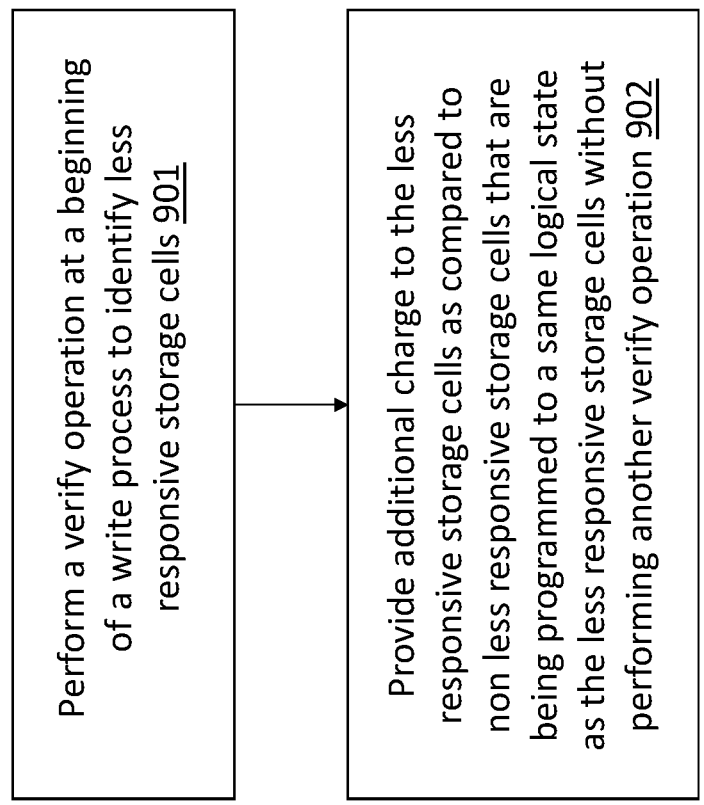
FIG. 9 shows a write method performed by a non volatile memory device.

FIG. 9 shows a method performed by a memory device or storage device (such as a solid state drive). As observed in FIG. 9, the method includes performing a verify operation 901 at a beginning of a write process to identify less responsive storage cells. The method also includes providing 902 additional charge to the less responsive storage cells as compared to non less responsive storage cells that are being programmed to a same logical state as the less responsive storage cells without performing another verify operation.

Figure 10:
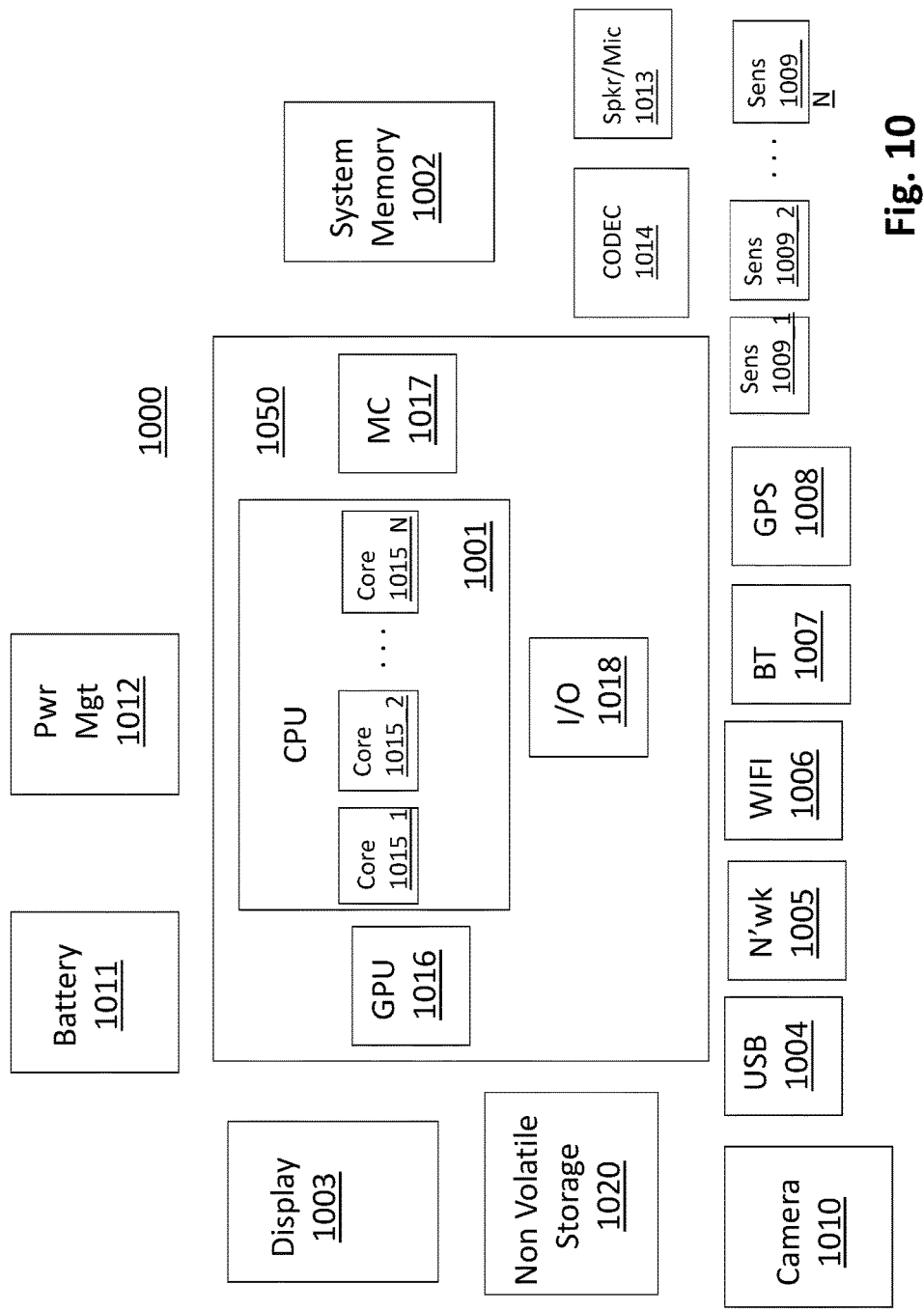
FIG. 10 shows a computing system.

FIG. 10 shows a depiction of an exemplary computing system 1000 such as a personal computing system (e.g., desktop or laptop) or a mobile or handheld computing system such as a tablet device or smartphone, or, a larger computing system such as a server computing system.

As observed in FIG. 10, the basic computing system may include a central processing unit 1001 (which may include, e.g., a plurality of general purpose processing cores and a main memory controller disposed on an applications processor or multi-core processor), system memory 1002, a display 1003 (e.g., touchscreen, flat-panel), a local wired point-to-point link (e.g., USB) interface 1004, various network I/O functions 1005 (such as an Ethernet interface and/or cellular modem subsystem), a wireless local area network (e.g., WiFi) interface 1006, a wireless point-to-point link (e.g., Bluetooth) interface 1007 and a Global Positioning System interface 1008, various sensors 1009_1 through 1009_N (e.g., one or more of a gyroscope, an accelerometer, a magnetometer, a temperature sensor, a pressure sensor, a humidity sensor, etc.), a camera 1010, a battery 1011, a power management control unit 1012, a speaker and microphone 1013 and an audio coder/decoder 1014.

An applications processor or multi-core processor 1050 may include one or more general purpose processing cores 1015 within its CPU 1001, one or more graphical processing units 1016, a memory management function 1017 (e.g., a memory controller) and an I/O control function 1018. The general purpose processing cores 1015 typically execute the operating system and application software of the computing system. The graphics processing units 1016 typically execute graphics intensive functions to, e.g., generate graphics information that is presented on the display 1003. The memory control function 1017 interfaces with the system memory 1002. The system memory 1002 may be a multi-level system memory.

Each of the touchscreen display 1003, the communication interfaces 1004-1007, the GPS interface 1008, the sensors 1009, the camera 1010, and the speaker/microphone codec 1013, 1014 all can be viewed as various forms of I/O (input and/or output) relative to the overall computing system including, where appropriate, an integrated peripheral device as well (e.g., the camera 1010). Depending on implementation, various ones of these I/O components may be integrated on the applications processor/multi-core processor 1050 or may be located off the die or outside the package of the applications processor/multi-core processor 1050. Non volatile storage 1020 may hold the BIOS and/or firmware of the computing system. Non volatile storage 1020 and possibly even system memory 1002 may be implemented with a non volatile memory device having the coarse and fine writing processes described at length above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

An apparatus has been described. The apparatus includes a non volatile memory device that includes a controller to implement a coarse write process for the non volatile memory device. The non volatile memory device includes storage cells to store more than two logic states, wherein, the coarse write process is to perform a verify operation early in the coarse write process to identify less responsive storage cells and provide additional charge to the less responsive storage cells as compared to non less responsive storage cells that are to be programmed to a same logical state as the less responsive storage cells without performing a following verify operation after each pulse of charge applied during the coarse write process.

In various embodiments coarse write process is to apply one additional charge transfer to the less responsive storage cells than the non less responsive cells. In extended embodiments the one additional charge transfer is also used to program other ones of the storage cells that are being programmed to a higher voltage logical state than the logical state that the less responsive storage cells are being programmed to.

In various embodiments, the write process further comprises a number of charge transfers that is equal to a number of different logical states being programmed. In various embodiments the additional charge produces a narrowed charge distribution for the logical state to which the less responsive storage cells are being programmed, the narrowed charge distribution characterized by an eliminated lower tail. In various embodiments the verify operation is performed and the additional charge is provided during a coarse phase of a write process that precedes a fine phase of the write process. In various embodiments the non volatile memory device is a FLASH device.

A computing system having the memory device has been described. A method for performing a coarse write process for a non volatile memory device has been described. The method includes performing a verify operation early in the coarse write method to identify less responsive storage cells. The method also includes providing additional charge to the less responsive storage cells as compared to non less responsive storage cells that are being programmed to a same logical state as the less responsive storage cells without performing a following verify operation after each pulse of charge applied during the coarse write process.

In various embodiments the write method is to apply one additional charge transfer to the less responsive storage cells than the non less responsive cells. In various embodiments the one additional charge transfer is also used to program other ones of the storage cells that are being programmed to a higher voltage logical state than the logical state that the less responsive storage cells are being programmed to. In various embodiments the coarse write method further comprises a number of charge transfers that is equal to a number of different logical states being programmed. In various embodiments the additional charge produces a narrowed charge distribution for the logical state to which the less responsive storage cells are being programmed, the narrowed charge distribution characterized by an eliminated lower tail. In various embodiments the verify operation is performed and the additional charge is provided during a coarse phase of a write method that precedes a fine phase of the write process.

The machine readable medium that stores program code that when executed implements the method has also been described.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a non volatile memory device comprising a controller to implement a coarse write process for the non volatile memory device, the non volatile memory device comprising storage cells to store more than two logic states, wherein, the coarse write process is to perform a verify operation after an initial charge pulse to identify less responsive storage cells and transfer additional charge to the less responsive storage cells as compared to non less responsive storage cells that are to be programmed to a same logical state as the less responsive storage cells without performing a following verify operation after each pulse of charge applied during the coarse write process.

2. The apparatus of claim 1 wherein the coarse write process is to apply one additional charge transfer to the less responsive storage cells than the non less responsive cells.

3. The apparatus of claim 2 wherein the one additional charge transfer is also used to program other ones of the storage cells that are being programmed to a higher voltage logical state than the logical state that the less responsive storage cells are being programmed to.

4. The apparatus of claim 1 wherein the coarse write process further comprises a number of charge transfers that is equal to a number of different logical states being programmed.

5. The apparatus of claim 1 where the additional charge produces a narrowed charge distribution for the logical state to which the less responsive storage cells are being programmed, the narrowed charge distribution characterized by an eliminated lower tail.

6. The apparatus of claim 1 wherein the verify operation is performed and the additional charge is provided during a coarse phase of a write process that precedes a fine phase of the write process.

7. The apparatus of claim 1 wherein the non volatile memory device is a FLASH device.

8. A computing system, comprising: a display;
a plurality of processing cores;
a main memory;
a main memory controller coupled between the plurality of processing cores and the main memory; and,
a non volatile memory device comprising a controller to implement a coarse write process for the non volatile memory device, the non volatile memory device comprising storage cells to store more than two logic states, wherein, the coarse write process is to perform a verify operation after an initial charge pulse to identify less responsive storage cells and transfer additional charge to the less responsive storage cells as compared to non less responsive storage cells that are to be programmed to a same logical state as the less responsive storage cells without performing a following verify operation after each pulse of charge applied during the coarse write process.

9. The computing system of claim 8 wherein the coarse write process is to apply one additional charge transfer to the less responsive storage cells than the non less responsive cells.

10. The computing system of claim 9 wherein the one additional charge transfer is also used to program other ones of the storage cells that are being programmed to a higher voltage logical state than the logical state that the less responsive storage cells are being programmed to.

11. The computing system of claim 8 wherein the coarse write process further comprises a number of charge transfers that is equal to a number of different logical states being programmed.

12. The computing system of claim 8 where the additional charge produces a narrowed charge distribution for the logical state to which the less responsive storage cells are being programmed, the narrowed charge distribution characterized by an eliminated lower tail.

13. The computing system of claim 8 wherein the verify operation is performed and the additional charge is provided during a coarse phase of a write process that precedes a fine phase of the write process.

14. The computing system of claim 13 wherein the coarse phase is followed by a fine phase of the write process.

15. A machine readable storage medium containing program code that when processed by a processor of a non volatile storage device causes a coarse write method to be performed, the non volatile storage device comprising storage cells that are able to store more than two logic states, the coarse write method comprising:
performing a verify operation after an initial charge pulse to identify less responsive storage cells; and,
transferring additional charge to the less responsive storage cells as compared to non less responsive storage cells that are being programmed to a same logical state as the less responsive storage cells without performing a following verify operation after each pulse of charge applied during the coarse write method.

16. The machine readable storage medium of claim 15 wherein the course write method is to apply one additional charge transfer to the less responsive storage cells than the non less responsive cells.

17. The machine readable storage medium of claim 16 wherein the one additional charge transfer is also used to program other ones of the storage cells that are being programmed to a higher voltage logical state than the logical state that the less responsive storage cells are being programmed to.

18. The machine readable storage medium of claim 15 wherein the coarse write method further comprises a number of charge transfers that is equal to a number of different logical states being programmed.

19. The machine readable storage medium of claim 15 where the additional charge produces a narrowed charge distribution for the logical state to which the less responsive storage cells are being programmed, the narrowed charge distribution characterized by an eliminated lower tail.

20. The machine readable storage medium of claim 15 wherein the verify operation is performed and the additional charge is provided during a coarse phase of a write method that precedes a fine phase of the coarse write method.

* * * * *